US011280869B2

(12) United States Patent
Gao et al.

(10) Patent No.: US 11,280,869 B2
(45) Date of Patent: Mar. 22, 2022

(54) MAGNETIC RESONANCE MEASUREMENT WITH PROSPECTIVE MOVEMENT CORRECTION

(71) Applicants: Siemens Healthcare GmbH, Erlangen (DE); Albert-Ludwigs-Universität Freiburg, Freiburg (DE)

(72) Inventors: Xiang Gao, Freiburg (DE); Tobias Kober, Lausanne (CH); Daniel Nicolas Splitthoff, Uttenreuth (DE); Maxim Zaitsev, Freiburg (DE)

(73) Assignees: Siemens Healthcare GmbH, Erlangen (DE); Albert-Ludwigs-Universität Freiburg, Freiburg (DE)

( * ) Notice: Subject to any disclaimer, the term of this patent is extended or adjusted under 35 U.S.C. 154(b) by 0 days.

(21) Appl. No.: 16/853,967

(22) Filed: Apr. 21, 2020

(65) Prior Publication Data

US 2020/0341097 A1 Oct. 29, 2020

(30) Foreign Application Priority Data

Apr. 25, 2019 (DE) .......................... 102019205914.7

(51) Int. Cl.
*G01R 33/561* (2006.01)
*G01R 33/565* (2006.01)
*G01R 33/56* (2006.01)
*G01R 33/48* (2006.01)

(52) U.S. Cl.
CPC ..... *G01R 33/5615* (2013.01); *G01R 33/4826* (2013.01); *G01R 33/5608* (2013.01); *G01R 33/56509* (2013.01)

(58) Field of Classification Search
USPC ........................................................ 324/307
See application file for complete search history.

(56) References Cited

U.S. PATENT DOCUMENTS

| 2009/0115794 | A1* | 5/2009 | Fukuta | G01R 33/56509 345/581 |
| 2012/0002858 | A1* | 1/2012 | Huang | G01R 33/5611 382/131 |
| 2012/0169339 | A1* | 7/2012 | Kunugi | G01R 33/56509 324/309 |
| 2012/0268124 | A1 | 10/2012 | Herbst | |
| 2014/0002078 | A1* | 1/2014 | Chen | G01R 33/56509 324/309 |
| 2017/0016972 | A1* | 1/2017 | Bhat | G01R 33/54 |

(Continued)

FOREIGN PATENT DOCUMENTS

DE 10201100757 A1 10/2012

OTHER PUBLICATIONS

Google Translation of German Office Action No. 10 2019 205 914.7 dated Feb. 21, 2020. (Year: 2020).*

(Continued)

*Primary Examiner* — Rodney E Fuller
(74) *Attorney, Agent, or Firm* — Lempia Summerfield Katz LLC

(57) ABSTRACT

A method is used to carry out a magnetic resonance measurement with at least one echo train with n spin echoes and prospective movement correction. Movement correction data for each echo train is updated at the start of the echo train and is then updated again at most partially for the spin echoes.

16 Claims, 2 Drawing Sheets

(56) References Cited

U.S. PATENT DOCUMENTS

2020/0333502 A1* 10/2020 Reiderman .......... G01V 99/005
2021/0003652 A1* 1/2021 Zeller .................... A61B 5/055

OTHER PUBLICATIONS

Aksoy, Murat, Julian Maclaren, and Roland Bammer. "Prospective motion correction for 3D pseudo-continuous arterial spin labeling using an external optical tracking system." Magnetic resonance imaging 39 (2017): 44-52.

German Office Action for German Application No. 10 2019 205 914.7 dated Feb. 21, 2020.

Maclaren, J., et al. "Kalman filtering framework for prospective motion correction." Proceedings of the 17th Scientific Meeting, International Society for Magnetic Resonance in Medicine, Honolulu, Hawaii. 2009. pp. 4602.

Zaitsev, Maxim, et al. "Magnetic resonance imaging of freely moving objects: prospective real-time motion correction using an external optical motion tracking system." Neuroimage 31.3 (2006): 1038-1050.

Xiang Gao et al., "SPACE sequence with optimized prospective motion correction", Department of Radiology, Medial Physics, Medical Center University of Freiburg, Faculty of Medicine, Universitiy of Freiburg, Nov. 7, 2018, ISMRM 2019, ID 6337. pp. 1-2.

Xiang Gao et al. "Intra echo train correction for constant flip angle Turbo Spin Echo sequence" Department of Radiology, Medical Physics, Medical Center University of Freiburg, Faculty of Medicine, University of Freiburg, ISMRM 2019, ID 6239, Nov. 7, 2018. pp. 1-2.

* cited by examiner

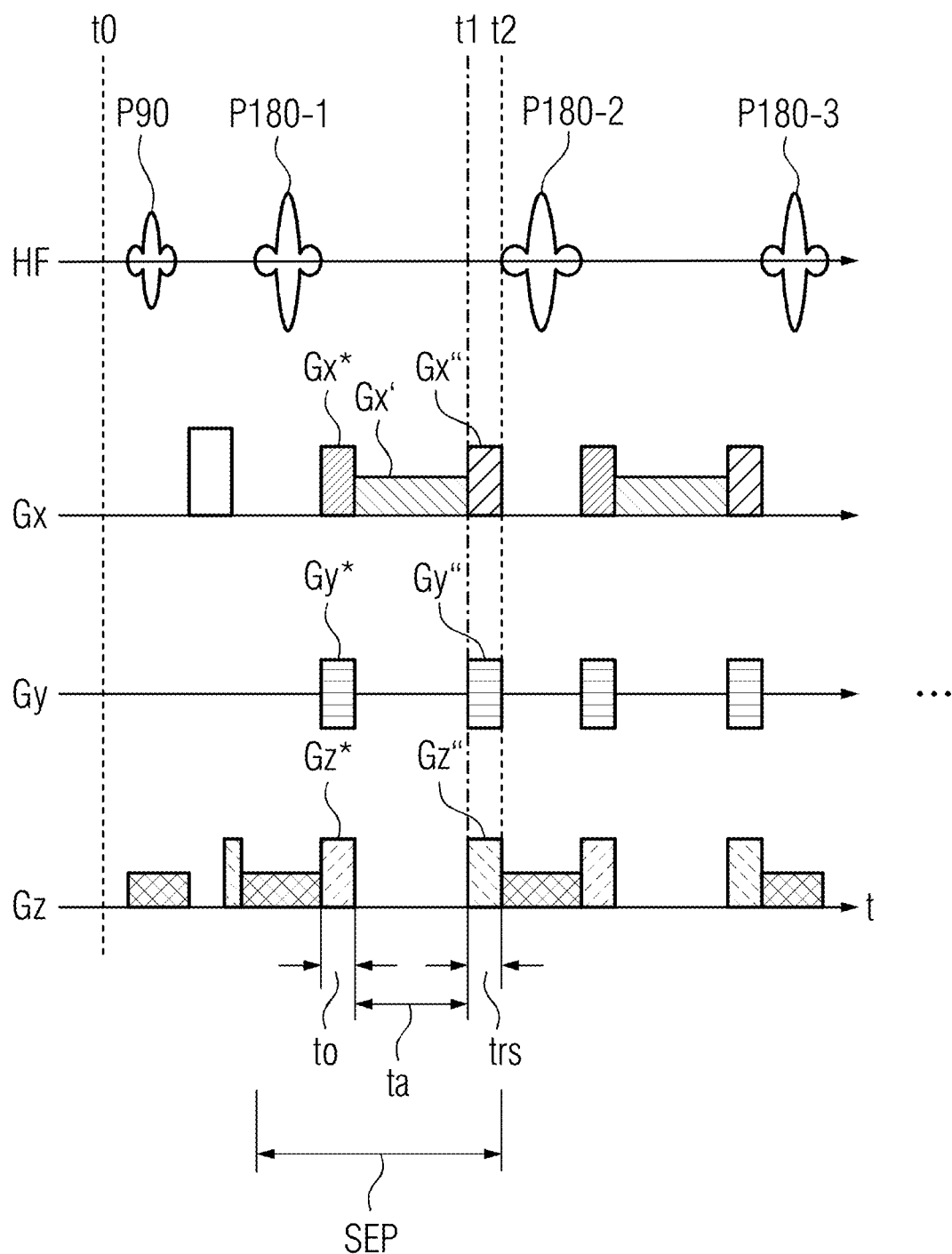

MAGNETIC RESONANCE MEASUREMENT WITH PROSPECTIVE MOVEMENT CORRECTION

CROSS REFERENCE TO RELATED APPLICATIONS

This patent application claims priority from German Application No. DE 102019205914.7 filed on Apr. 25, 2019, which is hereby incorporated in its entirety.

FIELD

Embodiments relate to a method for carrying out a magnetic resonance measurement with at least one echo train with n spin echoes and prospective movement correction.

BACKGROUND

Prospective movement correction for attenuating image artifacts in magnetic resonance (MR) imaging includes where a movement or change in position of an object to be measured, e.g. of a patient, is taken into account in the MR imaging so that the field of view (FOV), i.e. the three-dimensional spatial area that is to be imaged by the MR imaging and is normally defined at the start by an operator based on algorithms before an MR acquisition procedure or MR scan, is tracked on the basis of an identified movement of the object. Contrary to a retrospective movement correction, the field of view is still corrected during the MR acquisition procedure based on an identified movement of the object or based on the object's last determined position.

The movement occurring during an MR acquisition procedure or current position of the object may be measured by a movement acquisition modality, for example. A measurement of the movement or position of the object by such a movement acquisition modality may be implemented for example by tracking typical patterns in MR image data (e.g. navigator scans or MR images in a time series) or by data from an external tracking system, for example including one or more optical cameras or field probes. The result of this measurement may exist for example as values of 6D coordinate sets (with three degrees of translational freedom and three degrees of rotational freedom) or alternatively in the form of one or more quaternions or matrices. Prospective movement correction may adjust the field of view to a current position and/or to a predicted position of the monitored object. This is carried out for example by changing the orientation of the corresponding encoding gradients, and frequency and phase shifts in the current MR acquisition procedure.

The measured values determined by the movement acquisition modality may include measurement errors, for example a random measurement error, that is referred to as noise ("measurement noise"). On account of the measurement error, the applied movement correction of the field of view may turn out faulty. The noise may be reduced by a longer measurement duration and/or by superimposing measured data from a number of measuring procedures. However, particularly with stronger movements, the noise-independent, time-dependent measurement resolution is then reduced. The superimposition of measured data from a number of measuring procedures may be carried out by a sliding average, for example. The measurement noise is reduced or smoothed all the more, the more measuring time instants are taken into account. However, the time resolution is also reduced, the more measuring time instants are taken into account. The quantity of observed time instants may also be referred to as window width. The more time instants are observed, the greater therefore the window width. For example, in the event that a movement correction is based on images of a camera, the last p images may be averaged, by the associated measured values (e.g. brightness values) of the individual pixels being averaged pixel by pixel. The factor p then corresponds to the window width. The more images are used, or the larger the window width, the lower therefore the measurement noise, but the more blurred also the movement of the object to be acquired. The smoothing by a filter may be applied for example to already acquired 6D coordinates. Other temporal filtering approaches, such as, for example, Kalman filters, may also be used.

Some of the possible MR acquisition techniques are more susceptible to measurement noise than others. With some less susceptible MR acquisition techniques, the measurement noise of the movement acquisition modality, provided that it is sufficiently low, may even be easily ignored.

The family of spin echo sequences, that, per HR excitation, not only generate a spin echo by HR refocusing, but instead also generate a series of echoes by a series of HF refocusing pulses, known as the echo train, belongs to the MR acquisition techniques (known as pulse sequences or sequences) that are more susceptible to measurement noise. This family of spin echo sequences is also frequently referred to as "turbo spin echo" (TSE), "rapid imaging with refocused echoes" (RARE) or "fast spin echo" (FSE). The 3D variant of this measuring method is also referred to as SPACE. The reason behind the increase in susceptibility of these measuring methods is that when an echo train is used, a state is generated in which a pseudo steady state of the magnetization is formed during the imaging procedure. On account of the measurement noise of the movement acquisition modality, with MR acquisition techniques with spin echo train sequences the use of the movement correction with a high update frequency, for example before each refocusing or at least repeatedly per echo train, may then also still have a negative effect if a stationary object is acquired. In order to reduce the measurement noise, a temporal smoothing is selected with a large window width, as a result of which, however, as already described above, a temporal blurring or so-called "latency" is introduced into the movement correction. The increased latency reduces the ability of the correction system to compensate for spontaneous rapid object movements (for example patient movements when swallowing, coughing, etc.).

BRIEF SUMMARY AND DESCRIPTION

The scope of the present disclosure is defined solely by the appended claims and is not affected to any degree by the statements within this summary. The present embodiments may obviate one or more of the drawbacks or limitations in the related art.

Embodiments provide an improved capability for image correction with MR acquisition techniques based on spin echo sequences.

Embodiments provide a method for carrying out a magnetic resonance measurement with at least one echo train with n spin echoes and prospective movement correction, in which movement correction data (for example including the movement parameters or values thereof required to update the field of view) is updated for each echo train at the start of the echo train and is at most partially updated again for the individual spin echoes.

The effect of the error of the movement correction may be kept particularly low for an echo train since a trading and accumulation of faulty magnetization settings, that are effected by the measurement noise in the movement correction, may be reduced or even entirely avoided in combination with refocusing paths of the spin echo sequences.

In other words, at least one fresh update of the movement correction data is carried out where no update of the movement correction data takes place for at least one spin echo in the echo train.

If a movement correction is carried out, the field of view is determined on the basis of the currently existing movement correction data. If the movement correction data is not updated (and thus remains the same), the field of view is not changed by carrying out the movement correction. Only when the movement correction data is updated is the field of view tracked or updated on the basis of the movement correction data. This takes place, for example, by changing the orientation of the corresponding slice, phase and read gradients, and adjusting the frequency and phase shifts during the HF pulses and signal read-out procedures in the current MR acquisition procedure. For example, a movement correction may be carried out or the associated algorithm may run for each spin echo of an echo train. The field of view does not change without updating the movement correction data, however, and one such implementation of a movement correction therefore has no effect.

A magnetic resonance measurement with spin echo train includes, for example, a generation of an HF pulse signal in the form of an HF excitation, for example a 90° excitation by a 90° pulse, followed by a number (n>1) of HF pulse signals, known as HF refocusings, for example in the form of respective 180° pulses. The pulses of the HF refocusings are also referred to below as refocusing pulses. The n refocusing pulses generate corresponding n spin echoes. Embodiments may also be applied to excitations or refocusings, in which a smaller so-called flip angle than 180° is used, e.g. in order to avoid energy deposition limitations (known as SAR) or to extend an MR signal breakdown.

In an embodiment, magnetic field gradients suited to spatial resolution in the region of the object to be measured are applied to an excitation or refocusing pulse in two or three dimensions. This is also referred to as "phase encoding". This encoding, that may take place in one or two spatial dimensions, may include two parts: a so-called "prewinder" and a corresponding "rewinder". In addition, it is typical to twist a transversal magnetization produced undesirably by the refocusing pulse by so-called spoilers. The prewinder of the phase encoding is followed, for example, by a read-out segment, during which the spin echo is measured or read out. To this end, at least one gradient is likewise applied. The "rewinder" may be followed by the read-out segment, that again uses magnetic field gradients in two or three dimensions. As a last step a spoiler gradient may be connected before the subsequent refocusing pulse, the effect of which after the following refocusing pulse is canceled by an equivalent gradient; only the magnetization, that has been correctly refocused by the refocusing pulse, is merged again by the gradient after the refocusing pulse. The careful balancing of the two spoiler segments renders this step very sensitive to noise in the movement correction.

Since the movement correction data is updated for each echo train at the start of the echo train, the movement correction data is therefore updated before the first refocusing pulse is emitted. In an embodiment, the movement correction data is updated before the 90° pulse is emitted. A movement of the object may still be taken into account without a measurement noise being accumulated. However, the movement correction data may also be updated after the 90° pulse has been emitted but before the first refocusing pulse is emitted.

Since the movement correction data is updated at most partially for the individual spin echoes, therefore the movement correction data is not updated for each of the spin echoes, but only for a subset thereof. As a result, the accumulation of faulty magnetic moments is likewise reduced by reducing the number of updates to the movement correction data that have been carried out.

Since an update of the movement correction data is carried out "for" a spin echo, therefore the update takes place between the corresponding refocusing pulses.

In one embodiment, the data of the movement correction for each echo train is only updated once at the start of the echo train, for example before the 90° pulse is emitted. Within the scope of the echo train, no further update to the movement correction data is carried out, for example, not during a spin echo. In this case, the subset of the spin echoes, for which the update of the movement correction data is carried out, is empty. The embodiment may also be expressed in such a way that the movement correction data is only updated once for each echo train at the start of the echo train, for example before the 90° pulse is emitted. The embodiment may be used if the duration of the echo train is not very long or does not have many spin echoes, e.g. no more than n=10 spin echoes.

In one embodiment, the movement correction data is updated for each m'th spin echo of the echo train, wherein n>m. An accumulation of faulty magnetic moments compared with an updating of movement correction data for each of the spin echoes may be kept small and changes to the movement of the object during an echo train may still be taken into consideration. An update of the movement correction data may only be carried out for each second, third, fourth etc. spin echo. The first update may be carried out here for the first spin echo or offset thereto. If the first update is carried out for the first spin echo, for example, the next update is carried out for the (1+m)'th spin echo, etc. However, the first update may also be carried out for another spin echo, e.g. for the second spin echo. The next update is then carried out for the (2+m)'th spin echo, etc.

In an embodiment, m is an even number. The accumulation of faulty magnetic moments is reduced, for example for sequences with HF refocusing with a flip angle close to 180° or of 180°, for example with a flip angle of more than 150°, since the update is carried out during the same direction of rotation of the spins. In an embodiment, an update is carried out for each m'th spin echo of the echo train, wherein n>m and an update is additionally carried out at the start of the echo train, for example before the 90° pulse is emitted. Embodiments provide a method for carrying out a magnetic resonance measurement with at least one echo train with n spin echoes and prospective movement correction, in which the movement correction data is updated after a read-out segment and before a spoiler segment of a respectively associated spin echo period or an associated spin echo. The spoiler segment may be integrated into a rewinder and spoiler segment. The movement correction includes a minimal effect on the MR scan, since the spoiler segment sees the same realization of the measurement noise before and after the following refocusing pulse, i.e. the refocusing for this gradient moment is consistent. The advantage results for any number of updates for spin echoes, in other words also for the case that an update of the movement correction data is carried out for each spin echo.

In an embodiment, the movement correction data is updated for each echo train at the start of the echo train and is then carried out for the individual spin echoes at most partially and is carried out for the individual spin echoes after a read-out segment and before a spoiler segment (in particular rewinder and spoiler segment) of a respectively associated spin echo period.

Embodiments provide a method for carrying out a magnetic resonance measurement with at least one echo train with n spin echoes and prospective movement correction, in which the movement correction uses a smoothing filter for a number of consecutive movement measurements and is applied to at least two spin echoes with different k-space assignment with a different smoothing strength. The effect of the measurement noise is reduced which is advantageous in the case of long and very long echo trains.

In an embodiment, the smoothing filter calculates a sliding average of a number of movement measurements and the different smoothing strength includes a different window width. For other types of temporal filters, for example Kalman filters, the filter parameters may be adjusted dynamically so that the filter includes different smoothing strengths for the specific time or K-space segments.

In one embodiment, the smoothing strength for spin echoes with k-values close to the center of the k-space is stronger than for spin echoes with k-values further from the center. The majority of image contrast information is present close to the center of the k-space and is therefore the region of the k-space that reacts most sensitively to a noise. Particularly few image artifacts are produced in this region of the k-space by the stronger smoothing of the measurement noise. In the region of the k-space that is further away, the smoothing strength is reduced (possibly even to zero, i.e. no smoothing is carried out) in order to retain the accuracy of the edge information.

The difference in the smoothing strength as a function of the k-space position may be implemented in any way. A region of k-values close to the center of the k-space (that also includes the center) may have a first smoothing strength and k-values outside of this region may have a second, comparatively lower smoothing strength or grading. The region of k-values close to the center may be centered around the center. In addition to such a two-stage or grading of the smoothing strength, even more stages may be used. The smoothing strength tends to reduce over an increased distance from the center of the k-space.

Embodiments provide a method for carrying out a magnetic resonance measurement with at least one echo train with n spin echoes and prospective movement correction, in which the movement correction uses a smoothing filter for a number of consecutive movement measurements and the smoothing strength at the start of the echo train is stronger than at its end. The effect of the measuring noise is reduced. This embodiment may be advantageous in the case of long and very long echo trains. For example, the smoothing strength may be reduced after a specific number of continuous spin echo periods, possibly also in a number of stages.

In an embodiment, the reduction in the smoothing strength is applied by advancing the echo train together with the k-space-dependent definition, for example grading of the smoothing strength. The smoothing strength may therefore be both k-space-dependent and also time-dependent (or dependent on an echo number within the individual echo train).

Embodiments provide an MR tomography system that is configured to carry out a magnetic resonance measurement according to the method as described above.

BRIEF DESCRIPTION OF THE FIGURES

FIG. 2 depicts a pulse diagram of a start of a 2D MR scan using an echo train according to an embodiment.

DETAILED DESCRIPTION

Figure 1:
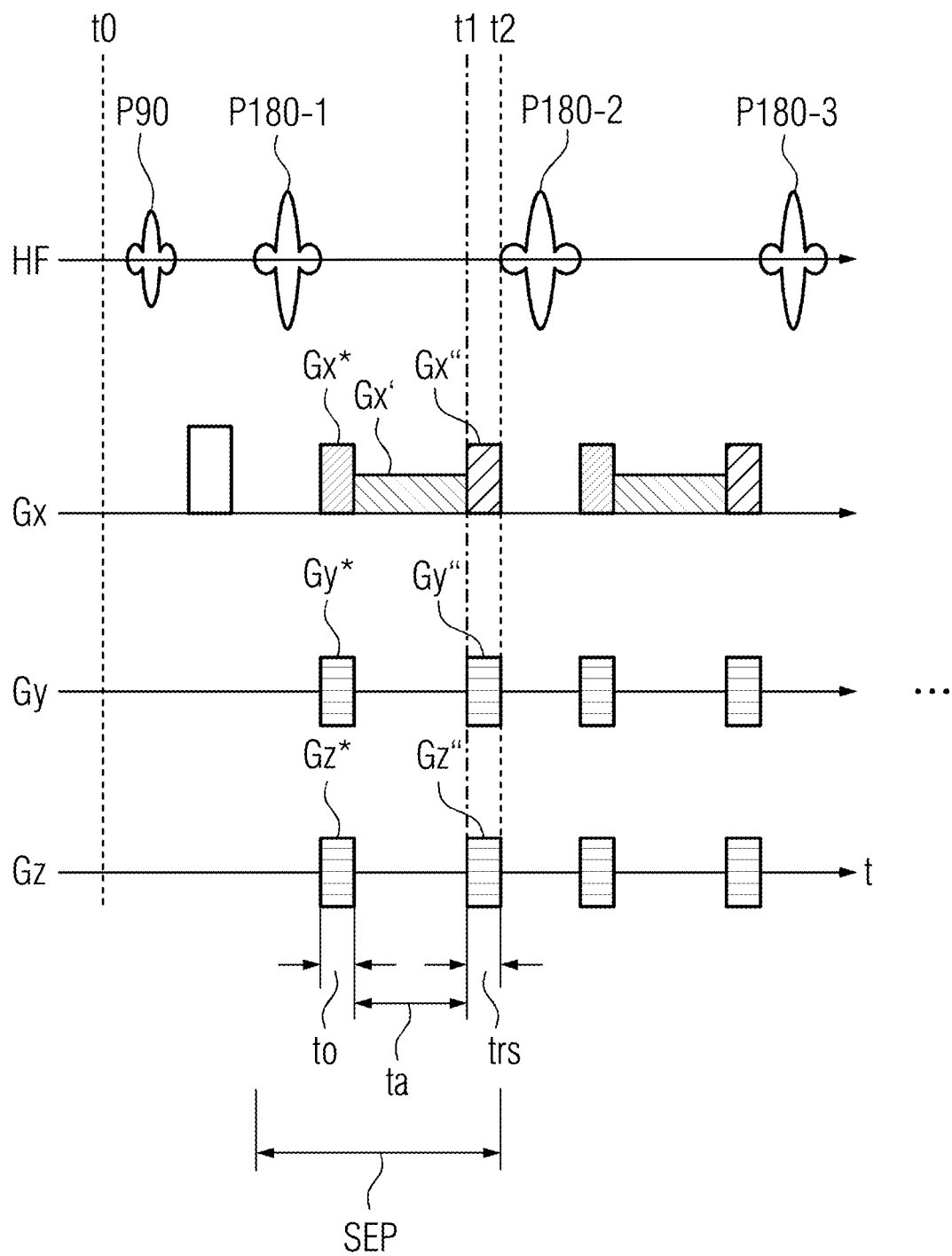
FIG. 1 depicts a pulse diagram of a start of a 3D MR scan using an echo train according to an embodiment.

FIG. 1 depicts a pulse diagram of a 3D MR scan at the start of an echo train using an HF pulse signal or HF excitation signal HF, a magnetic field gradient Gx in the x-direction, a magnetic field gradient Gy in the y-direction and a magnetic field gradient Gz in the z-direction over time t.

The MR scan may begin by generating an HF pulse signal in the form of a 90° excitation or a 90° pulse P90, followed by a number of 180° excitations or 108° pulses ("refocusing pulses" P180-1, 180-2, 180-3), for example, in an equidistant temporal sequence.

After each of the 180° pulses P180-1, P180-2, P180-3 has been emitted, gradients or gradient pulses Gx*, Gy* and Gz* suited to spatial resolution are applied, such as described here, for example, on the basis of the first refocusing pulse 180-1. The duration is referred to as spatial resolution segment.

A read-out segment ta, during which a gradient ("readout gradient") Gx' is generated, follows on from the spatial resolution segment to. During the read-out segment ta, the at least one pulse echo associated with the previously generated refocusing pulse P180 is read out. A further duration ("rewinder and spoiler segment") trs, during which the corresponding gradients Gx", Gy" and Gz" are generated, follows on from the read-out segment ta.

A further refocusing pulse P180-2 etc. follows on from the rewinder and spoiler segment trs until the echo train has been passed through after n echoes.

The duration between excitation of a refocusing pulse P180-1, 180-2, 180-3, etc. and termination of the following rewinder and spoiler segment trs may also be referred to as a spin echo period or echo spacing ESP associated with this refocusing pulse P180-1, 180-2, 180-3, etc.

FIG. 2 depicts a pulse diagram of a 2D MR scan at the start of an echo train using an HF pulse signal or HF excitation signal HF, a magnetic field gradient Gx in the x-direction, a magnetic field gradient Gy in the y-direction and a magnetic field gradient Gz relating to the slice selection in the z-direction over time t.

An update of the movement correction data and the corresponding correction carried out:

before that of the spin echo period of the first refocusing pulse P180-1, for example as marked before exciting the 90° pulse P90 at the time instant t0, and/or immediately after terminating the read-out segment ta and before the rewinder/spoiler segment trs (as indicated by the time instant t1 for the first refocusing pulse P180-1) of one of more spin echo periods SEP. The update of the movement correction data is only carried out every second, fourth etc. spin echo period SEP (above FIG.). The movement correction data is therefore not, as indicated by the time instant t2, updated between a refocusing pulse P180-2 and the preceding rewinder/spoiler segment trs.

According to an embodiment, the movement corrections for the spin echoes may have a smoothing filter, that includes a different smoothing strength as a function of the assignment of the spin echoes to the k-space, for example more significantly smoothed for k-values close to the center than for k-values remote from the center.

According to an embodiment, the smoothing filter with an advancing spin echo may have a decreasing smoothing strength.

Therefore, embodiments may be used for 2D MR scans and 3D MR scans with a constant or varying refocusing flip angle, e.g. for TSE and SPACE.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for carrying out a magnetic resonance measurement with at least one echo train with N spin echoes, the method comprising:
   updating movement correction data for each echo train at the start of the echo train; and
   updating the movement correction data again for only a subset of the N spin echoes.

2. The method of claim 1, wherein the movement correction data for each echo train is updated just once at the start of the echo train.

3. The method of in claim 1, wherein the movement correction data is updated for each M'th spin echo of the echo train, wherein N >M.

4. The method of claim 3, wherein M is an even number.

5. The method of claim 1, wherein updating the movement correction data is carried out after a read-out segment and before a spoiler segment of a spin echo period.

6. The method of claim 1, wherein updating the movement correction data uses a smoothing filter and is applied to at least two spin echoes with a different k-value with a different smoothing strength.

7. The method of claim 6, in which the smoothing strength for spin echoes with k-values close to a center of k-space is stronger than for spin echoes with further outwardly lying k-values.

8. The method of claim 1, wherein updating the movement correction data uses a smoothing filter and a smoothing strength at the start of the echo train is stronger than at its end.

9. An MR tomography system comprising:
   an MR tomography scanner configured to obtain magnetic resonance measurement data with at least one echo train with N spin echoes; and
   a processor configured to:
      update movement correction data for each echo train at the start of the echo train; and
      update the movement correction data again for only a subset of the N spin echoes.

10. The MR tomography system of claim 9, wherein the movement correction data for each echo train is updated just once at the start of the echo train.

11. The MR tomography system of claim 9, wherein the movement correction data is updated for each M'th spin echo of the echo train, wherein N >M.

12. The MR tomography system of claim 9, wherein M is an even number.

13. The MR tomography system of claim 9, wherein updating the movement correction data is carried out after a read-out segment and before a spoiler segment of a spin echo period.

14. The MR tomography system of claim 9, wherein updating the movement correction data uses a smoothing filter and is applied to at least two spin echoes with a different k-value with a different smoothing strength.

15. The MR tomography system of claim 14, in which the smoothing strength for spin echoes with k-values close to a center of k-space is stronger than for spin echoes with further outwardly lying k-values.

16. The MR tomography system of claim 9, wherein updating the movement correction data uses a smoothing filter and a smoothing strength at the start of the echo train is stronger than at its end.

* * * * *